United States Patent
Suriki et al.

(10) Patent No.: US 12,014,945 B2
(45) Date of Patent: Jun. 18, 2024

(54) OVERHEAD TRANSPORT VEHICLE AND METHOD FOR CALCULATING ROTATION AMOUNT OF WINDING DRUM IN OVERHEAD TRANSPORT VEHICLE

(71) Applicant: MURATA MACHINERY, LTD., Kyoto (JP)

(72) Inventors: Keiichiro Suriki, Ise (JP); Kazuya Aomoto, Ise (JP)

(73) Assignee: MURATA MACHINERY, LTD., Kyoto (JP)

(*) Notice: Subject to any disclaimer, the term of this patent is extended or adjusted under 35 U.S.C. 154(b) by 388 days.

(21) Appl. No.: 17/463,744

(22) Filed: Sep. 1, 2021

(65) Prior Publication Data
US 2022/0108905 A1 Apr. 7, 2022

(30) Foreign Application Priority Data
Oct. 7, 2020 (JP) .................. 2020-169670

(51) Int. Cl.
| | | |
|---|---|---|
| H01L 21/677 | (2006.01) | |
| B66C 13/23 | (2006.01) | |
| B66D 1/48 | (2006.01) | |
| G01B 21/00 | (2006.01) | |
| H01L 21/67 | (2006.01) | |
| B66C 19/00 | (2006.01) | |

(52) U.S. Cl.
CPC ........ *H01L 21/67733* (2013.01); *B66C 13/23* (2013.01); *B66D 1/485* (2013.01); *G01B 21/00* (2013.01); *H01L 21/67259* (2013.01); *H01L 21/67724* (2013.01); *B66C 19/00* (2013.01)

(58) Field of Classification Search
CPC ......... B66C 13/23; B66C 13/46; B66C 19/00; B66D 1/485; G01B 11/026; G01B 11/0608; G01B 21/00; G01B 21/06; G01B 21/12
See application file for complete search history.

(56) References Cited

U.S. PATENT DOCUMENTS

2019/0074204 A1    3/2019 Suriki

FOREIGN PATENT DOCUMENTS

JP            2009292644 A  * 12/2009

OTHER PUBLICATIONS

English Translation of Decision to Grant for Japanese Patent Application No. 2020-169670 dated Jun. 6, 2023 (Year: 2023).*

* cited by examiner

*Primary Examiner* — Mischita L Henson
(74) *Attorney, Agent, or Firm* — Keating & Bennett, LLP

(57) ABSTRACT

An overhead transport vehicle includes a lift stage to transfer an article, a winding drum to overlap and wind a suspension attached to the lift stage, and a controller to control a rotation amount of the winding drum to control a lifting/lowering amount of the lift stage. The controller is configured or programmed to execute a first processing including calculating, as individual values of the overhead transport vehicle, an individual value of an entire length of the suspension, an individual value of a diameter of the winding drum, and an individual value of a thickness of the suspension, and a second processing including calculating a rotation amount of the winding drum with respect to a lifting/lowering amount of the lift stage.

7 Claims, 6 Drawing Sheets

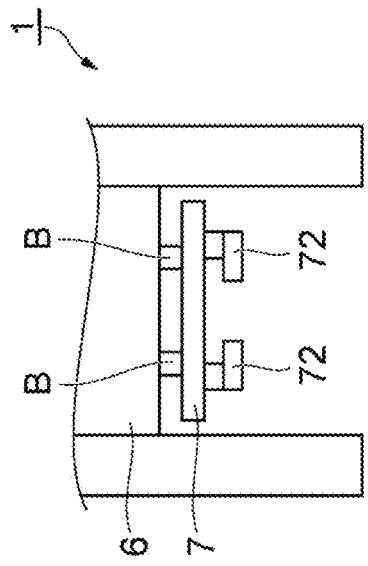
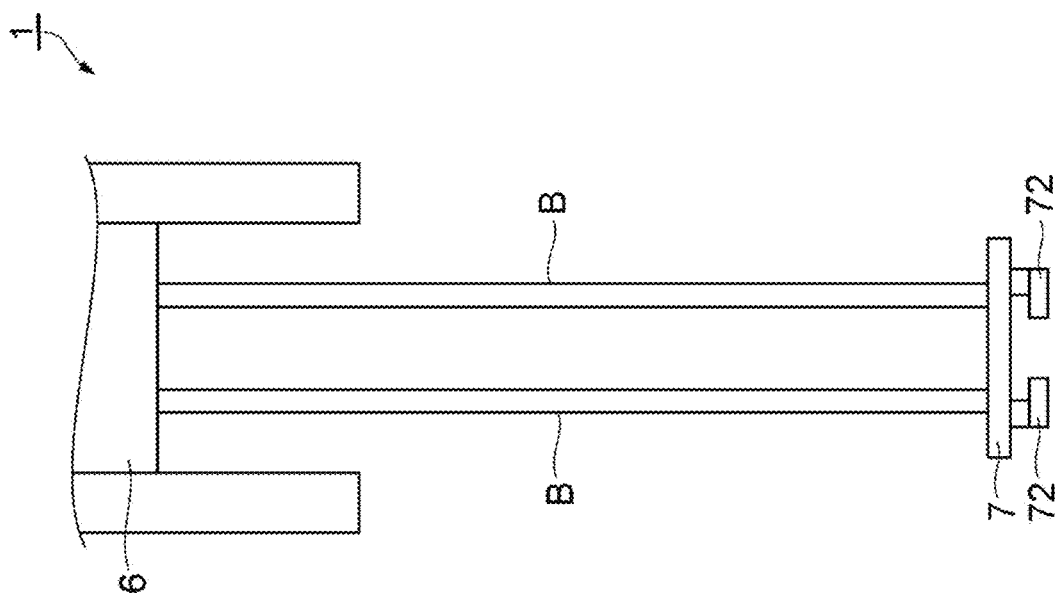

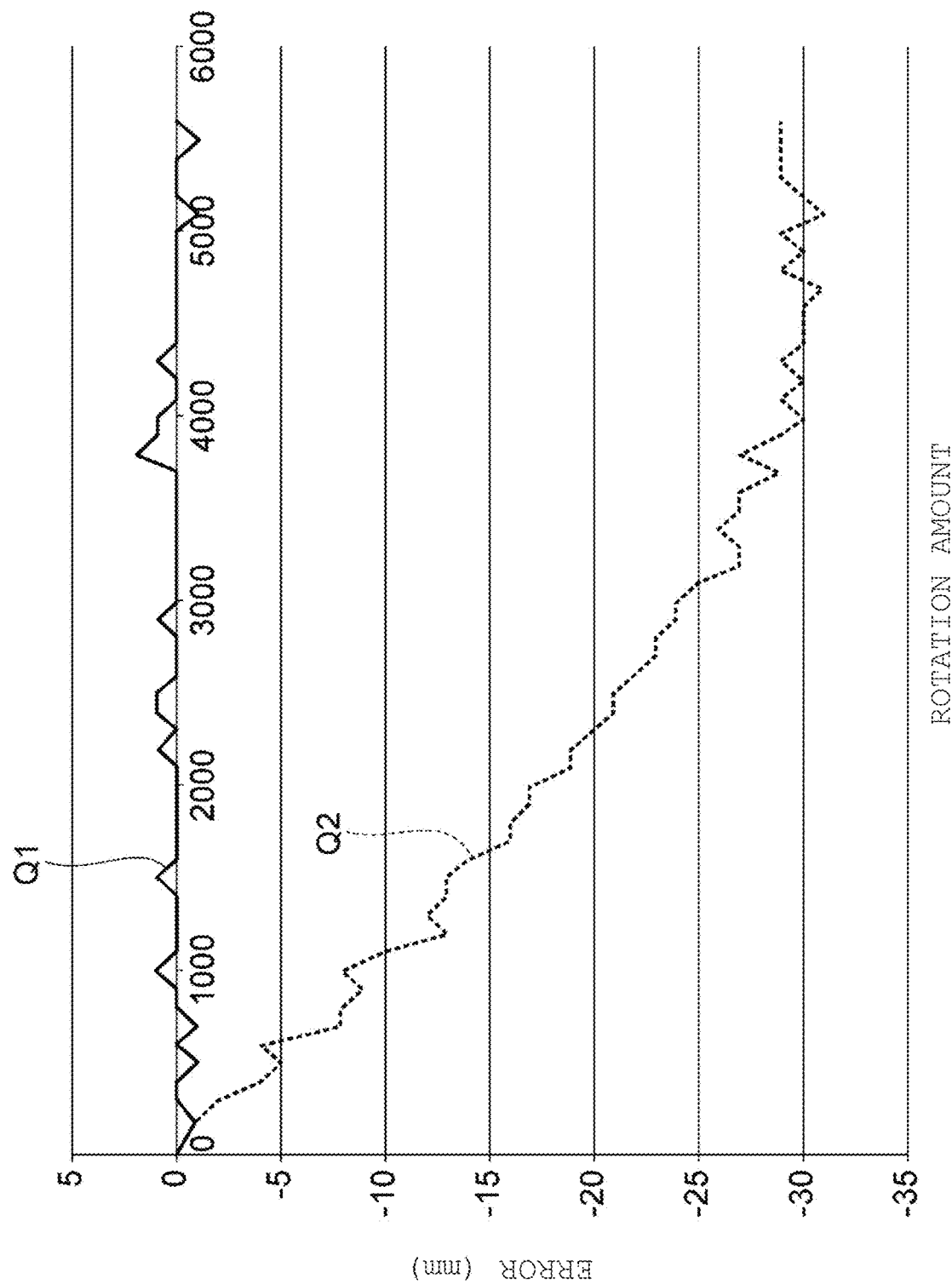

OVERHEAD TRANSPORT VEHICLE AND METHOD FOR CALCULATING ROTATION AMOUNT OF WINDING DRUM IN OVERHEAD TRANSPORT VEHICLE

CROSS REFERENCE TO RELATED APPLICATIONS

This application claims the benefit of priority to Japanese Patent Application No. 2020-169670 filed on Oct. 7, 2020. The entire contents of this application are hereby incorporated herein by reference.

BACKGROUND OF THE INVENTION

1. Field of the Invention

The present invention relates to an overhead transport vehicle and a method for calculating a rotation amount of a winding drum in the overhead transport vehicle.

2. Description of the Related Art

There is known an overhead transport vehicle including: a lift stage for transferring an article; a winding drum for overlapping and winding a suspension member attached to the lift stage; and a controller for controlling a rotation amount of the winding drum to control a lifting/lowering amount of the lift stage (e.g., see Japanese Unexamined Patent Publication No. 2019-43720).

In the technique as described above, the thickness of the suspension member of each overhead transport vehicle is obtained, and the rotation amount of the winding drum with respect to the lifting/lowering amount of the lift stage is determined using the obtained thickness of the suspension member. Accordingly, when the lift stage is lifted or lowered to a desired height position (transfer heights), the influence due to an individual difference in the thickness of the suspension member is reduced. However, even in this case, the individual difference in the overhead transport vehicle cannot be said to be sufficiently considered, there is a possibility that the lifted or lowered lift stage actually deviates from the desired height position, and there is still room for improvement.

SUMMARY OF THE INVENTION

Therefore, preferred embodiments of the present invention provide overhead transport vehicles each capable of reliably lifting or lowering a lift stage to a desired height position even when there is an individual difference in the overhead transport vehicle, and provide methods for calculating a rotation amount of a winding drum in the overhead transport vehicle.

An overhead transport vehicle according to a preferred embodiment of the present invention includes a lift stage to transfer an article, a winding drum to overlap and wind a suspension attached to the lift stage, and a controller to control a rotation amount of the winding drum to control a lifting/lowering amount of the lift stage. The controller is configured or programmed to execute first processing including calculating, as individual values of the overhead transport vehicle, an individual value of an entire length of the suspension, an individual value of a diameter of the winding drum, and an individual value of a thickness of the suspension, and a second processing including calculating a rotation amount of the winding drum with respect to a lifting/lowering amount of the lift stage based on the individual value of the entire length of the suspension, the individual value of the diameter of the winding drum, and the individual value of the thickness of the suspension calculated in the first processing.

In this overhead transport vehicle, the individual value of the entire length of the suspension, the individual value of the diameter of the winding drum, and the individual value of the thickness of the suspension are calculated, and the rotation amount of the winding drum with respect to the lifting/lowering amount of the lift stage is calculated based on these individual values. Thus, the rotation amount of the winding drum with respect to the lifting/lowering amount of the lift stage can be determined with due consideration of the individual difference or differences in the overhead transport vehicle. Therefore, even when there is an individual difference(s) in the overhead transport vehicle, the lift stage can be reliably lifted or lowered to the desired height position.

In an overhead transport vehicle according to a preferred embodiment of the present invention, in the first processing, the individual value of the entire length of the suspension, the individual value of the diameter of the winding drum, and the individual value of the thickness of the suspension may be calculated using a fact that the lifting/lowering amount of the lift stage is approximated by a square function of the rotation amount of the winding drum, the square function including as coefficients, the individual value of the entire length of the suspension, the individual value of the diameter of the winding drum, and the individual value of the thickness of the suspension. As a result of intensive studies, the inventors of preferred embodiments of the present invention have discovered that the lifting/lowering amount of the lift stage is approximated by a square function of the rotation amount of the winding drum, the square function including as coefficients, the individual value of the entire length of the suspension, the individual value of the diameter of the winding drum, and the individual value of the thickness of the suspension. Therefore, by using the approximation, these individual values can be obtained easily and accurately.

In an overhead transport vehicle according to a preferred embodiment of the present invention, in the first processing, the individual value of the entire length of the suspension, the individual value of the diameter of the winding drum, and the individual value of the thickness of the suspension may be calculated based on a data group including two or more pieces of sample data including the lifting/lowering amount of the lift stage and the rotation amount of the winding drum at a time of that lifting/lowering amount. In this case, the individual value of the entire length of the suspension, the individual value of the diameter of the winding drum, and the individual value of the thickness of the suspension can be easily and accurately obtained using the data group.

In an overhead transport vehicle according to a preferred embodiment of the present invention, in the first processing, the individual value of the entire length of the suspension, the individual value of the diameter of the winding drum, and the individual value of the thickness of the suspension may be calculated based on the equations listed below. Accordingly, the individual value of the entire length of the suspension, the individual value of the diameter of the winding drum, and the individual value of the thickness of the suspension can be obtained more easily and accurately.

$$L = An^2 + Bn + C \quad (1)$$

$$-\pi t = A \quad (2)$$

$$\pi(D + 2tn_0) = B \quad (3)$$

$$L_0 - \pi n_0(D + tn_0) = C = 0 \quad (4)$$

$$A = \frac{\sum_{i=1}^{N} n_i^2 \times \sum_{i=1}^{N} L_i n_i^2 - \sum_{i=1}^{N} n_i^3 \times \sum_{i=1}^{N} L_i n_i^2}{\sum_{i=1}^{N} n_i^4 \times \sum_{i=1}^{N} n_i^2 - \sum_{i=1}^{N} n_i^3 \times \sum_{i=1}^{N} n_i^3} \quad (5)$$

$$B = \frac{-\sum_{i=1}^{N} n_i^3 \times \sum_{i=1}^{N} L_i n_i^2 + \sum_{i=1}^{N} n_i^4 \times \sum_{i=1}^{N} L_i n_i}{\sum_{i=1}^{N} n_i^4 \times \sum_{i=1}^{N} n_i^2 - \sum_{i=1}^{N} n_i^3 \sum_{i=1}^{N} n_i^3} \quad (6)$$

where L is the lifting/lowering amount of the lift stage, n is the rotation amount of the winding drum, t is the individual value of the thickness of the suspension, D is the individual value of the diameter of the winding drum, $L_0$ is the individual value of the entire length of the suspension, $n_0$ is the rotation amount of the winding drum when the lift stage is positioned at an origin position, N is a number of samples that is an integer of 2 or more, $n_i$ is the rotation amount of the winding drum in an ith sample, and $L_i$ is the lifting/lowering amount of the lift stage in the ith sample.

In an overhead transport vehicle according to a preferred embodiment of the present invention, the controller may be configured or programmed to execute a first data acquiring processing of acquiring, as a first distance, a distance detected by a sensor that detects a distance between a first measurer on the lift stage and a second measurer disposed immediately below the first measurer in a state where the lift stage is positioned at the origin position, a second data acquiring processing of acquiring a distance detected by the sensor as a second distance in a state where the lift stage has been lifted or lowered by a set lifting/lowering amount and acquiring a value obtained by subtracting the first distance from the second distance and the rotation amount of the winding drum at a time of the set lifting/lowering amount as the lifting/lowering amount of the lift stage and the rotation amount of the winding drum in the sample data, and a third data acquiring processing of repeatedly executing the second data acquiring processing while changing the set lifting/lowering amount. Thus, at least two sample data can be acquired automatically.

An overhead transport vehicle according to a preferred embodiment of the present invention may include an input capable of inputting the set lifting/lowering amount in each of the second data acquiring processing performed a plurality of times. In this case, each set lifting/lowering amount can be appropriately input.

In an overhead transport vehicle according to a preferred embodiment of the present invention, in the second processing, the rotation amount of the winding drum with respect to the lifting/lowering amount of the lift stage may be calculated based on the equation listed below. Accordingly, the rotation amount of the winding drum with respect to the lifting/lowering amount of the lift stage can be obtained easily and accurately.

$$L = L_0 - \pi(D(n_0-n) + t(n_0-n)^2) \quad (7)$$

where L is the lifting/lowering amount of the lift stage, n is the rotation amount of the winding drum, t is the individual value of the thickness of the suspension, D is the individual value of the diameter of the winding drum, $L_0$ is the individual value of the entire length of the suspension, and $n_0$ is the rotation amount of the winding drum when the lift stage is positioned at an origin position.

A method for calculating a rotation amount of a winding drum in an overhead transport vehicle according to a preferred embodiment of the present invention is a method for calculating a rotation amount of a winding drum in an overhead transport vehicle including a lift stage that transfers an article, the winding drum that overlaps and winds a suspension attached to the lift stage, and a controller that controls a rotation amount of the winding drum to control a lifting/lowering amount of the lift stage, the method including calculating, as individual values of the overhead transport vehicle, an individual value of an entire length of the suspension, an individual value of a diameter of the winding drum, and an individual value of a thickness of the suspension, and calculating a rotation amount of the winding drum with respect to a lifting/lowering amount of the lift stage based on the individual value of the entire length of the suspension, the individual value of the diameter of the winding drum, and the individual value of the thickness of the suspension calculated in the first step.

In the method for calculating the rotation amount of the winding drum in the overhead transport vehicle, the individual value of the entire length of the suspension, the individual value of the diameter of the winding drum, and the individual value of the thickness of the suspension are calculated, and the rotation amount of the winding drum with respect to the lifting/lowering amount of the lift stage is calculated based on these individual values. Thus, the rotation amount of the winding drum with respect to the lifting/lowering amount of the lift stage can be determined with due consideration for the individual difference in the overhead transport vehicle. Therefore, even when there is an individual difference in the overhead transport vehicle, the lift stage can be reliably lifted or lowered to the desired height position.

According to preferred embodiments of the present invention, even when there is an individual difference in the overhead transport vehicle, the lift stage can be reliably lifted or lowered to the desired height position.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3A is a side view for explaining a case of acquiring a rotation amount of a winding drum when a lift stage is positioned at an origin position in the overhead transport vehicle of FIG. 1; FIG. 3B is a side view illustrating the continuation of FIG. 3A.

FIG. 5 is a graph illustrating an error in the lifting/lowering amount of the lift stage with respect to the rotation amount of the winding drum.

DETAILED DESCRIPTION OF THE PREFERRED EMBODIMENTS

Figure 1:
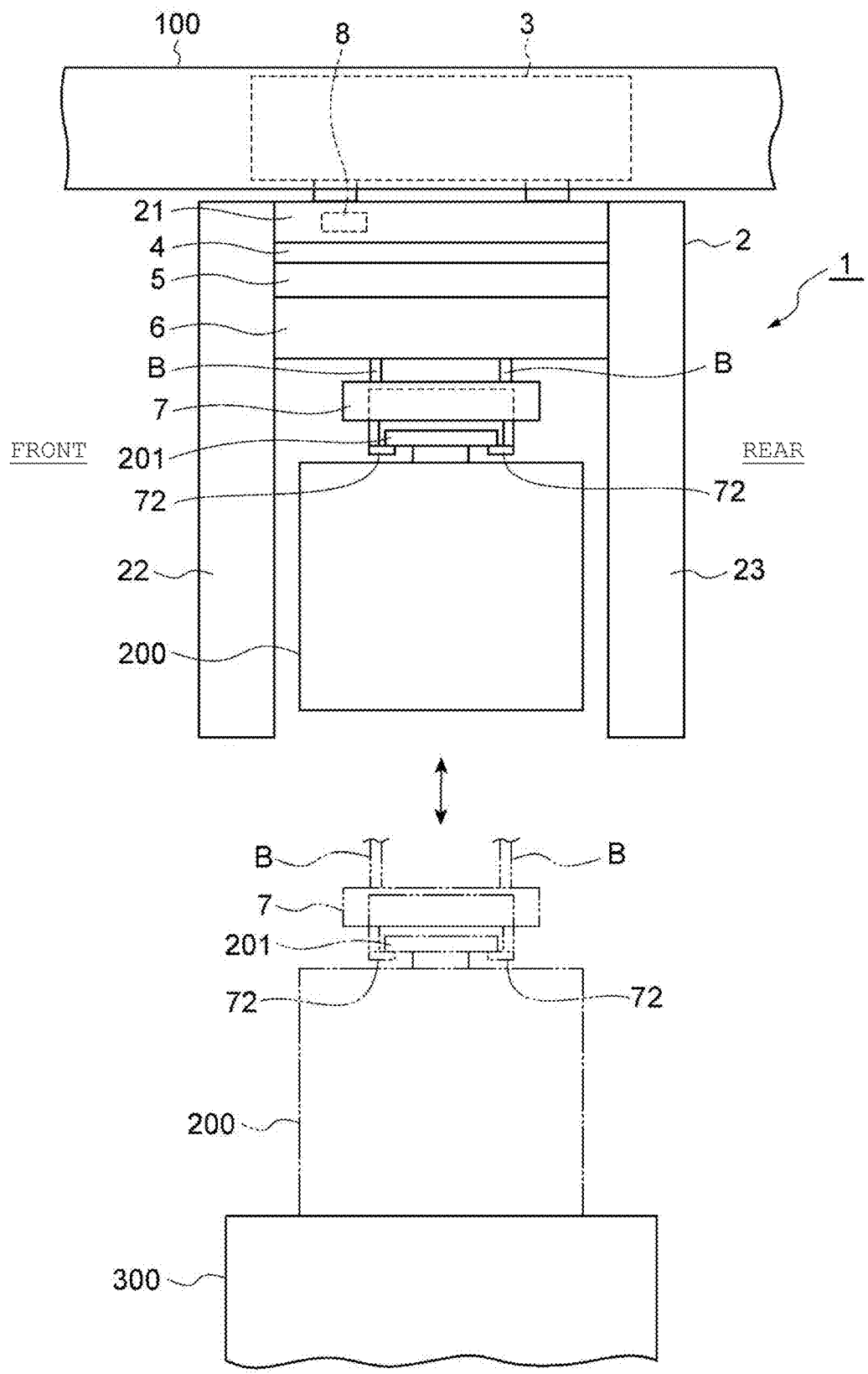
FIG. 1 is a side view illustrating an overhead transport vehicle according to a preferred embodiment of the present invention.

Hereinafter, preferred embodiments will be described with reference to the drawings. In descriptions of the drawings, the same elements are provided with the same reference numerals, and a repeated description is omitted. A dimensional ratio of the drawing does not necessarily coincide with that in the description.

As illustrated in FIG. 1, an overhead transport vehicle 1 of a preferred embodiment of the present invention travels along a track 100 laid near a ceiling of a clean room where a semiconductor device is manufactured. The overhead transport vehicle 1 according to the present preferred embodiment transports a front opening unified pod (FOUP) (article) 200, in which a plurality of semiconductor wafers are accommodated, and transfers the FOUP 200 to a load port (transfer part) 300 or the like provided in a processing apparatus that performs various types of processing on the semiconductor wafers.

The overhead transport vehicle 1 includes a frame unit 2, a traveling unit 3, a lateral unit 4, a theta unit 5, a lift drive unit 6, a lift stage 7, and a controller 8. The frame unit 2 includes a center frame 21, a front frame 22, and a rear frame 23. The front frame 22 extends downward from the front end of the center frame 21. The rear frame 23 extends downward from the rear end of the center frame 21. Note that the front side and the rear side mean the front side and the rear side in the traveling direction of the overhead transport vehicle 1, respectively.

The traveling unit 3 is disposed above the center frame 21. The traveling unit 3 travels along the track 100, for example, by receiving power supply in a non-contact manner from a high-frequency current line laid along the track 100. The lateral unit 4 is disposed below the center frame 21. The lateral unit 4 moves the theta unit 5, the lift drive unit 6, and the lift stage 7 in the lateral direction (laterally in the traveling direction of the overhead transport vehicle 1). The theta unit 5 is disposed below the lateral unit 4. The theta unit 5 rotates the lift drive unit 6 and the lift stage 7 in a horizontal plane.

The lift drive unit 6 is disposed below the theta unit 5. The lift drive unit 6 lifts or lowers the lift stage 7. The lift stage 7 is disposed below the lift drive unit 6. The lift stage 7 transfers the FOUP 200. The lift stage 7 includes a pair of grippers (gripping parts) 72 that holds a flange 201 of the FOUP 200. The pair of grippers 72 is supported so as to be openable and closable along the horizontal direction. The pair of grippers 72 is opened and closed by a drive motor (not illustrated) and a link mechanism (not illustrated). The controller 8 is disposed in the center frame 21. The controller 8 is an electronic control unit including a central processing unit (CPU), a read-only memory (ROM), a random-access memory (RAM), and the like. The controller 8 is configured or programmed to control each element or portion of the overhead transport vehicle 1.

As an example, the overhead transport vehicle 1 configured as described above operates as follows. When the FOUP 200 is to be transferred from the load port 300 to the overhead transport vehicle 1, the overhead transport vehicle 1 not holding the FOUP 200 stops above the load port 300. When the horizontal position of the lift stage 7 is shifted from the position directly above the load port 300, the lateral unit 4 and the theta unit 5 are driven to finely adjust the horizontal position and angle of the lift stage 7 together with the lift drive unit 6. The lift drive unit 6 then lowers the lift stage 7, and the lift stage 7 holds the flange 201 of the FOUP 200 placed on the load port 300. Subsequently, the lift drive unit 6 lifts the lift stage 7 to an origin position (a rising end) to dispose the FOUP 200 between the front frame 22 and the rear frame 23. The overhead transport vehicle 1 holding the FOUP 200 then starts traveling.

On the other hand, when the FOUP 200 is to be transferred from the overhead transport vehicle 1 to the load port 300, the overhead transport vehicle 1 holding the FOUP 200 stops above the load port 300. When the horizontal position of the lift stage 7 (FOUP 200) is shifted from the position directly above the load port 300, the lateral unit 4 and the theta unit 5 are driven to finely adjust the horizontal position and angle of the lift stage 7 together with the lift drive unit 6 The lift drive unit 6 then lowers the lift stage 7 to place the FOUP 200 on the load port 300, and the lift stage 7 releases the holding of the flange 201 of the FOUP 200. Subsequently, the lift drive unit 6 lifts the lift stage 7 to the rising end. Then, the overhead transport vehicle 1 not holding the FOUP 200 starts traveling.

Figure 2:
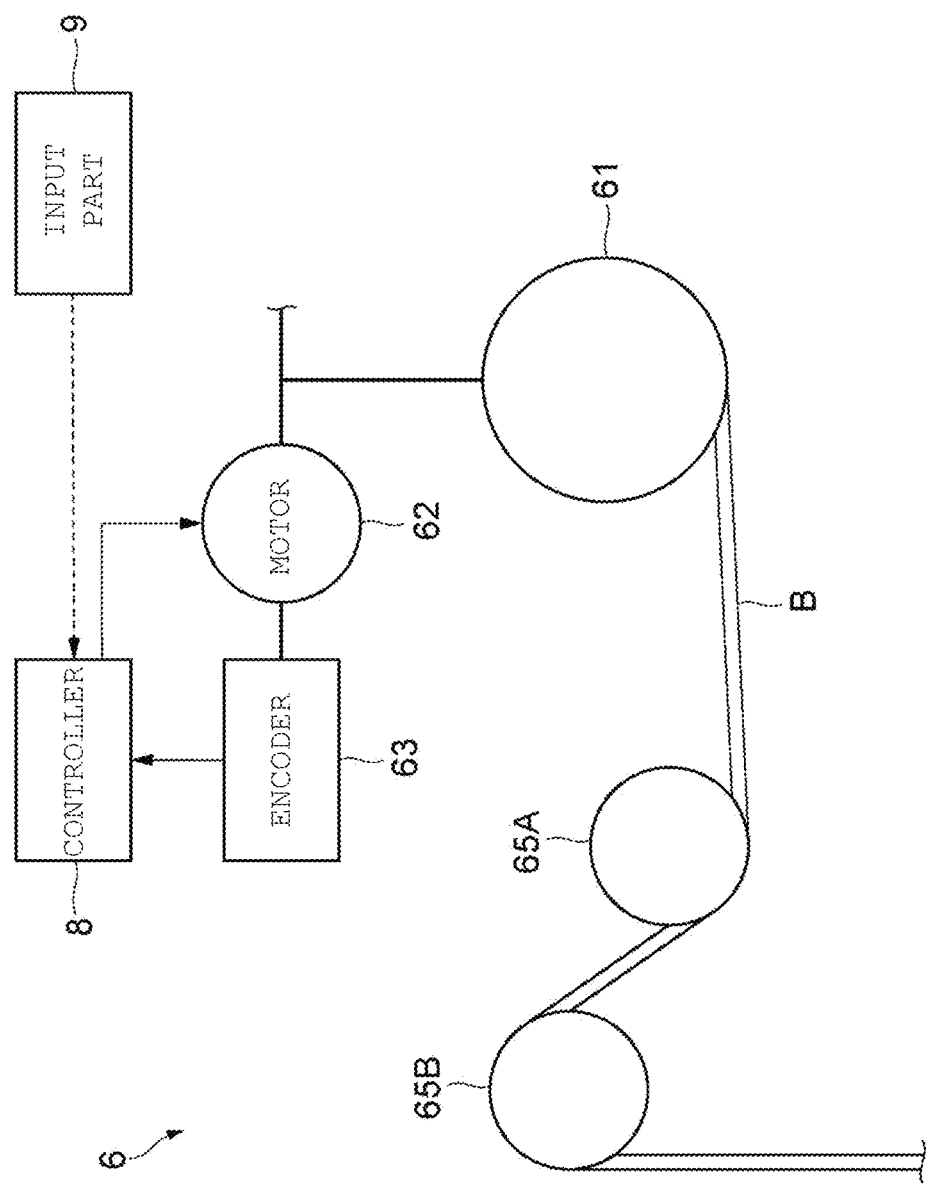
FIG. 2 is a view illustrating a schematic configuration of a lift drive unit of FIG. 1.

Next, the configuration of the lift drive unit 6 will be described. As illustrated in FIGS. 1 and 2, the lift drive unit 6 includes a winding drum 61, a motor 62, an encoder 63, a belt B, and idler rollers 65A, 65B.

The winding drum 61 winds up or unwinds each of the belts B by the drive by the motor 62. Here, four winding drums 61 are provided, for example. The motor 62 is a drive source for rotating each winding drum 61. The motor 62 drives the four winding drums 61 via, for example, a common rotation shaft (not illustrated).

The encoder 63 detects a rotation amount (drive amount) of the motor 62. The encoder 63 outputs a count value related to the rotation amount of the motor 62 to the controller 8. The belt B is a suspension that suspends and holds the lift stage 7. Four belts B are provided. One end of each belt B is connected to the lift stage 7. The other end of each belt B is connected to each of the four winding drums 61. The idler rollers 65A, 65B guide the movement of the belt B.

In the present preferred embodiment, the controller 8 controls the rotation amount of the winding drum 61 to control the lifting/lowering amount of the lift stage 7. The controller 8 executes first processing of calculating an individual value of the entire length of the belt B, an individual value of the diameter of the winding drum 61, and an individual value of the thickness of the belt as individual values of the overhead transport vehicle 1. The rotation amount of the winding drum 61 can be acquired based on the count value of the encoder 63.

In the first processing, the individual value of the entire length of the belt B, the individual value of the diameter of the winding drum 61, and the individual value of the thickness of the belt B are calculated using the fact that the lifting/lowering amount of the lift stage 7 is approximated by a square function (an error correction function by the least-squares method) of the rotation amount of the winding drum 61 including the individual value of the entire length of the belt B, the individual value of the diameter of the winding drum 61, and the individual value of the thickness of the belt B as Ts. In the first processing, the individual value of the diameter of the winding drum 61, and the individual value of the thickness of the belt B are calculated based on a data group including two or more pieces of sample data including the lifting/lowering amount of the lift stage 7 and the rotation amount of the winding drum 61 at the time of that lifting/lowering amount, the individual value of the entire length of the belt B.

First, a principle of the first processing will be described. A basic calculation equation of the lifting/lowering amount of the lift stage 7 is the following equation (8), which can be rearranged and expressed by the following equation (9):

$$L = L_0 - \pi(D(n_0 - n) + t(n_0 - n)^2) \tag{8}$$

$$L = (-\pi t)n^2 + (\pi(D + 2tn_0))n + (L_0 - \pi n_0(D + tn_0)) \tag{9}$$

where L is the lifting/lowering amount of the lift stage 7, n is the rotation amount of the winding drum 61, t is the individual value of the thickness of the belt B, D is the individual value of the diameter of the winding drum 61, $L_0$ is the individual value of the entire length of the belt B, and $n_0$ is the rotation amount of the winding drum 61 when the lift stage 7 is positioned at an origin position.

From the above equation (8), when the parameters A, B, C are expressed by the following equations (10) to (12), the lifting/lowering amount of L of the lift stage 7 can be expressed by the following equation (13). When the rotation amount n of the winding drum 61 is 0, the lifting/lowering amount L of the lift stage 7 is 0, so that the parameter C=0 is satisfied.

$$-\pi t = A \tag{10}$$

$$\pi(D + 2tn_0) = B \tag{11}$$

$$L_0 - \pi n_0(D + tn_0) = C \tag{12}$$

$$L = An^2 + Bn + C \tag{13}$$

When the number of acquired samples is N (an integer of 2 or more), the data group of the approximation function and a sum S of the square errors can be expressed by the following equation (14). At this time, in order to obtain the parameters A, B that minimize the error, $\delta S/\delta A = 0$ and $\delta S/\delta B = 0$ as shown in the following equation (15) hold.

$$S = \sum_{i=1}^{N} (L_i - An_i^2 - Bn_i)^2 \tag{14}$$

$$S = \sum_{i=1}^{N} (L_i - 2BL_in_i - 2AL_in_i^2 + B^2n_i^2 + 2ABn_i^3 + A^2n_i^4)^2$$

$$\frac{\delta S}{\delta A} = 2\sum_{i=1}^{N} (An_i^4 - L_in_i^2 - Bn_i^3) = 0 \tag{15}$$

$$\frac{\delta S}{\delta B} = 2\sum_{i=1}^{N} (Bn_i^4 - L_in_i^2 - An_i^3) = 0$$

The parameters A, B can be obtained from simultaneous equations of the following equations (16) and (17) as shown in the following equations (18) to (23). It can thus be seen from the results of the parameters A, B that the individual value t of the thickness of the belt B and the individual value D of the diameter of the winding drum 61 can be calculated. In the parameter C (cf. the above equation (12)), the individual value $L_0$ of the entire length of the belt B can be calculated by substituting the individual value t of the thickness of the belt B and the individual value D of the diameter of the winding drum 61.

$$A\sum_{i=1}^{N} n_i^4 + B\sum_{i=1}^{N} n_i^3 = \sum_{i=1}^{N} L_in_i^2 \tag{16}$$

$$A\sum_{i=1}^{N} n_i^3 + B\sum_{i=1}^{N} n_i^2 = \sum_{i=1}^{N} L_in_i \tag{17}$$

$$\begin{pmatrix} \sum_{i=1}^{N} n_i^4 & \sum_{i=1}^{N} n_i^3 \\ \sum_{i=1}^{N} n_i^3 & \sum_{i=1}^{N} n_i^2 \end{pmatrix} \begin{pmatrix} A \\ B \end{pmatrix} = \begin{pmatrix} \sum_{i=1}^{N} L_in_i^2 \\ \sum_{i=1}^{N} L_in_i \end{pmatrix} \tag{18}$$

$$\begin{pmatrix} A \\ B \end{pmatrix} = \begin{pmatrix} \sum_{i=1}^{N} n_i^4 & \sum_{i=1}^{N} n_i^3 \\ \sum_{i=1}^{N} n_i^3 & \sum_{i=1}^{N} n_i^2 \end{pmatrix}^{-1} \begin{pmatrix} \sum_{i=1}^{N} L_in_i^2 \\ \sum_{i=1}^{N} L_in_i \end{pmatrix} \tag{19}$$

$$\begin{pmatrix} A \\ B \end{pmatrix} = \frac{1}{(\sum_{i=1}^{N} n_i^4 \times \sum_{i=1}^{N} n_i^2) - (\sum_{i=1}^{N} n_i^3 \times \sum_{i=1}^{N} n_i^3)} \begin{pmatrix} \sum_{i=1}^{N} n_i^2 & -\sum_{i=1}^{N} n_i^3 \\ -\sum_{i=1}^{N} n_i^3 & \sum_{i=1}^{N} n_i^4 \end{pmatrix} \begin{pmatrix} \sum_{i=1}^{N} L_in_i^2 \\ \sum_{i=1}^{N} L_in_i \end{pmatrix} \tag{20}$$

$$\begin{pmatrix} A \\ B \end{pmatrix} = \frac{1}{(\sum_{i=1}^{N} n_i^4 \times \sum_{i=1}^{N} n_i^2) - (\sum_{i=1}^{N} n_i^3 \times \sum_{i=1}^{N} n_i^3)} \begin{pmatrix} \sum_{i=1}^{N} n_i^2 \times \sum_{i=1}^{N} L_in_i^2 - \sum_{i=1}^{N} n_i^3 \times \sum_{i=1}^{N} L_in_i \\ -\sum_{i=1}^{N} n_i^3 \times \sum_{i=1}^{N} L_in_i^2 + \sum_{i=1}^{N} n_i^4 \times \sum_{i=1}^{N} L_in_i \end{pmatrix} \tag{21}$$

$$A = \frac{\sum_{i=1}^{N} n_i^2 \times \sum_{i=1}^{N} L_in_i^2 - \sum_{i=1}^{N} n_i^3 \times \sum_{i=1}^{N} L_in_i}{\sum_{i=1}^{N} n_i^4 \times \sum_{i=1}^{N} n_i^2 - \sum_{i=1}^{N} n_i^3 \times \sum_{i=1}^{N} n_i^3} \tag{22}$$

$$B = \frac{-\sum_{i=1}^{N} n_i^3 \times \sum_{i=1}^{N} L_in_i^2 + \sum_{i=1}^{N} n_i^4 \times \sum_{i=1}^{N} L_in_i}{\sum_{i=1}^{N} n_i^4 \times \sum_{i=1}^{N} n_i^2 - \sum_{i=1}^{N} n_i^3 \times \sum_{i=1}^{N} n_i^3} \tag{23}$$

where t is the individual value of the thickness of the belt B, D is the individual value of the diameter of the winding drum 61, $L_0$ is the individual value of the entire length of the belt B, $n_0$ is the rotation amount of the winding drum 61 when the lift stage 7 is positioned at an origin position, N is the number of samples (an integer of 2 or more), $n_i$ is a rotation amount of the winding drum 61 in an ith sample, and $L_i$ is the lifting/lowering amount of the lift stage 7 in the ith sample.

Therefore, in the present preferred embodiment, in the first processing, the individual value $L_0$ of the entire length of the belt B, the individual value D of the diameter of the winding drum 61, and the individual value t of the thickness of the belt B are calculated based on the above equations (10) to (13), (22), and (23).

When the lifting/lowering amount of L of the lift stage 7 is input, the controller 8 executes second processing of calculating the rotation amount of the winding drum 61 with respect to the lifting/lowering amount of L based on the individual value $L_0$ of the entire length of the belt B, the individual value D of the diameter of the winding drum 61, and the individual value t of the thickness of the belt B calculated in the first processing. In the second processing, the rotation amount of the winding drum 61 with respect to the lifting/lowering amount of L of the lift stage 7 is calculated based on the above equation (8). Then, the controller 8 controls the drive of the motor 62 based on the rotation amount of the winding drum 61 calculated in the second processing and lifts or lowers the lift stage 7 to a desired height position (e.g., a height position where the lift stage 7 holds the FOUP 200 of the load port 300 and a height position where the lift stage 7 places the FOUP 200 on the load port 300).

The controller 8 executes the following processing of acquiring the rotation amount $n_0$ of the winding drum 61 when the lift stage 7 is positioned at the origin position. That is, as illustrated in FIG. 3A, the controller 8 first drives the motor 62 such that the entire belt B is pulled out from the winding drum 61, and acquires the rotation amount of the winding drum 61 (the count value of the encoder 63) at this time as a first rotation amount. Subsequently, as illustrated in FIG. 3B, the controller 8 drives the motor 62 such that the belt B is wound around the winding drum 61 until the lift stage 7 is positioned at the origin position, and acquires the rotation amount of the winding drum 61 (the count value of the encoder 63) at this time as a second rotation amount. Then, the controller 8 acquires a value obtained by subtracting the second rotation amount from the first rotation amount as the rotation amount $n_0$ of the winding drum 61 when the lift stage 7 is positioned at the origin position.

The controller 8 executes the first to third data acquiring processing to acquire a data group including first sample data to Nth sample data. The ith sample data (i is an integer from 1 to N) is data including the rotation amount $n_i$ of the winding drum 61 in the ith sample and the lifting/lowering amount of $L_i$ of the lift stage 7 in the ith sample. Hereinafter, the first to third data acquiring processing will be specifically described.

Figure 4A:
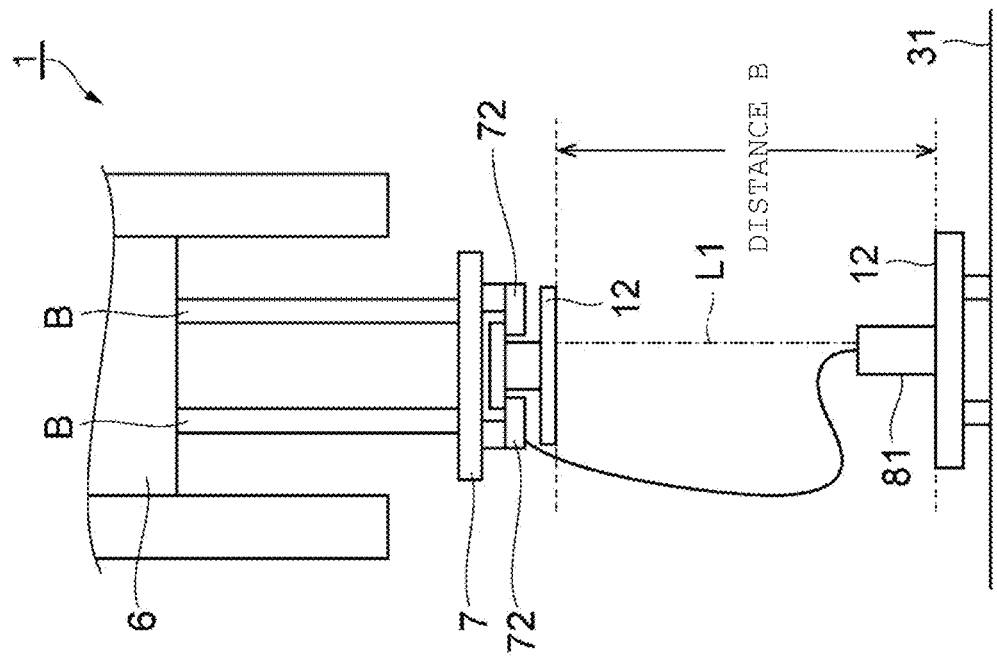
FIG. 4A is a side view for explaining first to third data acquiring processing in the overhead transport vehicle of FIG. 1.

As illustrated in FIG. 4A, first, a first measuring member 11 is held by the lift stage 7, and a second measuring member 12 is disposed on the floor 31 immediately below the first measuring member 11. The first measuring member 11 includes a flange held by a pair of grippers 72. The lower surface of the first measuring member 11 has a flat surface. The second measuring member 12 includes a pedestal placed on the floor 31. The upper surface of the second measuring member 12 has a flat surface. A sensor 81 is provided on the second measuring member 12. The sensor 81 is a sensor that detects a distance between the first measuring member 11 and the second measuring member 12. As the sensor 81, for example, a laser range finder that emits a laser beam L1 is used. The sensor 81 transmits data on the detected distance to the controller 8.

The controller 8 executes the first data acquiring processing. In the first data acquiring processing, the motor 62 is controlled so as to position the lift stage 7 at the origin position such that the winding drum 61 has the rotation amount no, and in this state, the distance between the first measuring member 11 and the second measuring member 12 detected by the sensor 81 is acquired as a first distance.

Figure 4B:
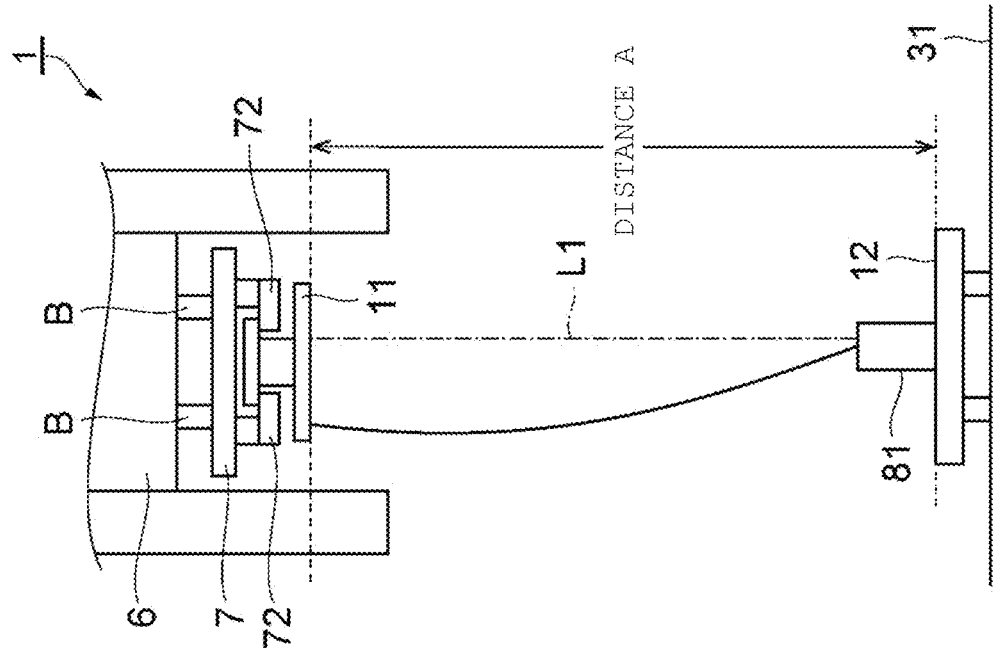
FIG. 4B is a side view illustrating the continuation of FIG. 4A.

Subsequently, the controller 8 executes the second data acquiring processing. In the second data acquiring processing, as illustrated in FIG. 4B, in a state where the lift stage 7 has been lifted or lowered by a set lifting/lowering amount, a distance detected by the sensor 81 is acquired as a second distance, and a value obtained by subtracting the first distance from the second distance and the rotation amount of the winding drum 61 at the time of that set lifting/lowering amount are acquired as the lifting/lowering amount of the lift stage 7 and the rotation amount of the winding drum 61 in the first sample data. Then, the controller executes the third data acquiring processing. In the third data acquiring processing, the second data acquiring processing is repeatedly executed (N−1 times) while changing the set lifting/lowering amount. As a result, the first to Nth sample data are acquired. Here, N is 4, for example.

As illustrated in FIG. 2, the overhead transport vehicle 1 includes an input part 9 capable of inputting a set lifting/lowering amount in each of second data acquiring processing performed a plurality of times. The input part 9 is not particularly limited but may be, for example, a communication device that inputs each set lifting/lowering amount by communication from the outside or a touch panel that inputs each set lifting/lowering amount by a touch operation.

As described above, in the overhead transport vehicle 1, the individual value $L_0$ of the entire length of the belt B, the individual value D of the diameter of the winding drum 61, and the individual value t of the thickness of the belt B are calculated, and the rotation amount of the winding drum 61 with respect to the lifting/lowering amount of the lift stage 7 is calculated based on these individual values. Thus, the rotation amount of the winding drum 61 with respect to the lifting/lowering amount of the lift stage 7 can be determined with due consideration for the individual difference in the overhead transport vehicle 1. Therefore, even when there is an individual difference in the overhead transport vehicle 1, the lift stage 7 can be reliably lifted or lowered to the desired height position.

As a result of intensive studies, the inventors of preferred embodiments of the present invention have discovered that the lifting/lowering amount of the lift stage 7 is approximated by a square function of the rotation amount of the winding drum 61, the square function including, as coefficients, the individual value $L_0$ of the entire length of the belt B, the individual value D of the diameter of the winding drum 61, and the individual value t of the thickness of the belt B. In the overhead transport vehicle 1, in the first processing, the individual value $L_0$ of the entire length of the belt B, the individual value D of the diameter of the winding drum 61, and the individual value t of the thickness of the belt B are calculated using the approximation. Hence, it is possible to obtain these individual values easily and accurately.

In the overhead transport vehicle 1, in the first processing, the individual value $L_0$ of the entire length of the belt B, the individual value D of the diameter of the winding drum 61, and the individual value t of the thickness of the belt B are calculated based on a data group including two or more pieces of sample data including the lifting/lowering amount of the lift stage 7 and the rotation amount of the winding drum 61 at the time of that lifting/lowering amount. Thus, these individual values can be easily and accurately obtained using the data group.

In the overhead transport vehicle 1, in the first processing, the individual value $L_0$ of the entire length of the belt B, the individual value D of the diameter of the winding drum 61, and the individual value t of the thickness of the belt B are calculated based on the above equations (10) to (13), (22), and (23). Accordingly, the individual value $L_0$ of the entire length of the belt B, the individual value D of the diameter of the winding drum 61, and the individual value t of the thickness of the belt B can be obtained more easily and accurately.

In the overhead transport vehicle 1, the controller 8 may execute a first data acquiring processing of acquiring, as a first distance, a distance detected by a sensor 81 in a state where the lift stage 7 is positioned at the origin position, a second data acquiring processing of acquiring a distance detected by the sensor 81 as a second distance in a state where the lift stage 7 has been lifted or lowered by a set lifting/lowering amount and acquiring a value obtained by subtracting the first distance from the second distance and the rotation amount of the winding drum 61 at a time of that set lifting/lowering amount as the sample data, and a third data acquiring processing of repeatedly executing the second data acquiring processing while changing the set lifting/lowering amount. Thus, at least two sample data can be acquired automatically.

The overhead transport vehicle 1 includes the input part 9 capable of inputting the set lifting/lowering amount in each of the second data acquiring processing performed a plurality of times. In this case, each set lifting/lowering amount can be appropriately input via the input part 9.

In the overhead transport vehicle 1, in the second processing, the rotation amount of the winding drum 61 with respect to the lifting/lowering amount of L of the lift stage 7 is calculated based on the above equation (8). Accordingly, the rotation amount of the winding drum 61 with respect to the lifting/lowering amount of the lift stage 7 can be obtained easily and accurately.

In the overhead transport vehicle 1 configured as described above, the following method for calculating the rotation amount of the winding drum 61 may be performed. That is, the individual value $L_0$ of the entire length of the belt B, the individual value D of the diameter of the winding drum 61, and the individual value t of the thickness of the belt B are calculated as the individual values of the overhead transport vehicle 1 (first step). Subsequently, the rotation amount of the winding drum 61 with respect to the lifting/lowering amount of the lift stage 7 is calculated based on the individual value $L_0$ of the entire length of the belt B, the individual value D of the diameter of the winding drum 61, and the individual value t of the thickness of the belt B which have been calculated (second step).

Also, in the method for calculating the rotation amount of the winding drum 61 in the overhead transport vehicle 1, the individual value $L_0$ of the entire length of the belt B, the individual value D of the diameter of the winding drum 61, and the individual value t of the thickness of the belt B are calculated, and the rotation amount of the winding drum 61 with respect to the lifting/lowering amount of the lift stage 7 is calculated based on these individual values. Thus, the rotation amount of the winding drum 61 with respect to the lifting/lowering amount of the lift stage 7 can be determined with due consideration for the individual difference in the overhead transport vehicle 1. Therefore, even when there is an individual difference in the overhead transport vehicle 1, the lift stage 7 can be reliably lifted or lowered to the desired height position.

FIG. 5 is a graph illustrating an error in the lifting/lowering amount of the lift stage 7 with respect to the rotation amount of the winding drum 61. The horizontal axis indicates the rotation amount of the winding drum 61 (the count value of the encoder 63). The vertical axis represents an error (mm) between a measured value and a calculated value for the lifting/lowering amount of the lift stage 7. In the figure, Q1 is an evaluation result according to an example, and Q2 is an evaluation result according to a comparative example. The example corresponds to the overhead transport vehicle 1 of the present preferred embodiment. The comparative example corresponds to a conventional overhead transport vehicle using a general method for calculating the rotation amount of the winding drum 61 (a method for calculating the rotation amount by using the entire length of the belt B, the diameter of the winding drum 61, and the thickness of the belt B as fixed values).

As illustrated in FIG. 5, in the example, it can be seen that an error in the lifting/lowering amount of the lift stage 7 can be reduced. Thus, in the example, it can be seen that the lift stage 7 can be reliably lifted or lowered to the desired height position. In the comparative example, it can be seen that the error in the lifting/lowering amount of the lift stage 7 is large, and in particular, there is a relationship in which the error increases in terms of the square function as the rotation amount of the winding drum 61 increases.

The preferred embodiments of the present invention have been described above, but the present invention is not limited to the above preferred embodiments. In the above preferred embodiments, various modifications can be made without departing from the gist of the present invention.

Figure 6A:
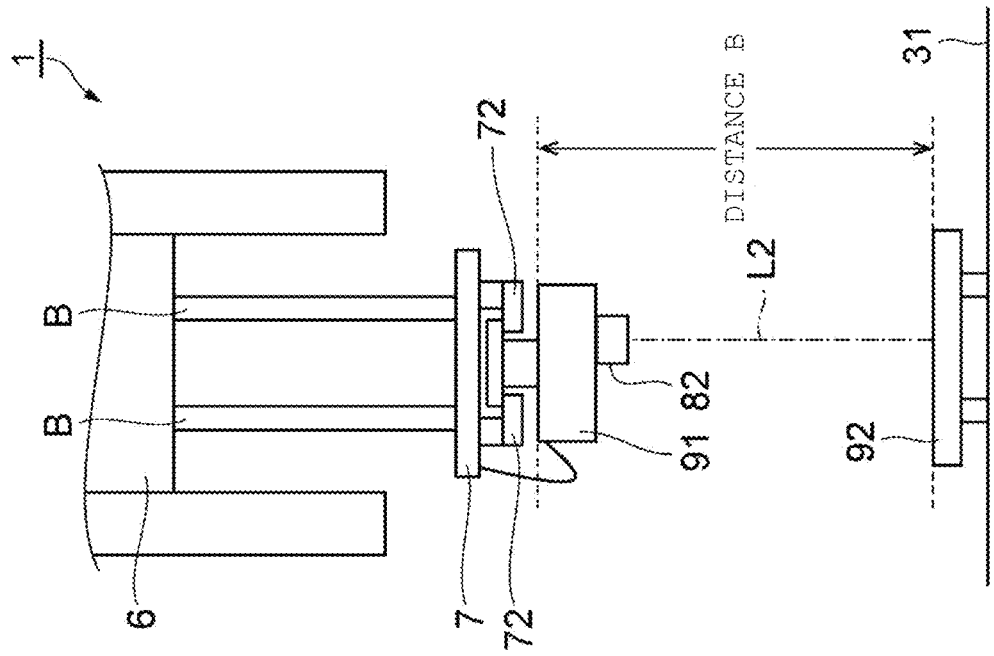
FIG. 6A is another side view for explaining the first to third data acquiring processing in the overhead transport vehicle of FIG. 1.
Figure 6B:
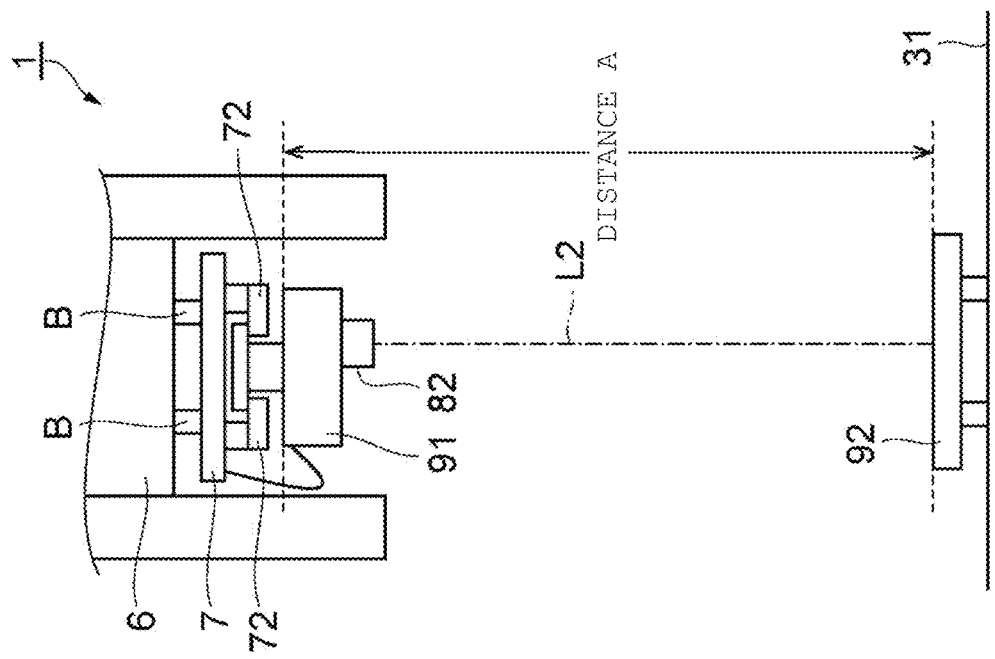
FIG. 6B is a side view illustrating a continuation of FIG. 6A.

As illustrated in FIG. 6, in the first to third data acquiring processing, a first measuring member 91 may be held by the lift stage 7, and a second measuring member 92 may be disposed on the floor 31 immediately below the first measuring member 91. In this case, a sensor 82 that detects the distance between the first measuring member 91 and the second measuring member 92 may be provided below the first measuring member 91. As the sensor 82, for example, a laser range finder that emits a laser beam L2 may be used.

In the above preferred embodiments, the sample data has been automatically acquired by the first to third data acquiring processing, but the present invention is not limited thereto, and the sample data may be acquired by user input, or the sample data may be acquired by external communication. Similarly, the rotation amount $n_0$ of the winding drum 61 when the lift stage 7 is positioned at the origin position may be acquired by user input or may be acquired by external communication. In the above preferred embodiments, the lift stage 7 may be suspended by three or five or more belts B, for example.

In the above preferred embodiments, the individual value $L_0$ of the entire length of the belt B, the individual value D of the diameter of the winding drum 61, and the individual value t of the thickness of the belt B have been calculated based on the above equations (10) to (13), (22), and (23), but the present invention is not limited thereto. The individual value $L_0$ of the entire length of the belt B, the individual value D of the diameter of the winding drum 61, and the individual value t of the thickness of the belt B may be calculated using an approximate function different from the equations (10) to (13), (22), and (23).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An overhead transport vehicle comprising:
a lift stage to transfer an article;
a winding drum to overlap and wind a suspension attached to the lift stage; and
a controller to control a rotation amount of the winding drum to control a lifting/lowering amount of the lift stage; wherein
the controller is configured or programmed to execute:
a first processing including calculating, as individual values of the overhead transport vehicle, an individual value of an entire length of the suspension, an individual value of a diameter of the winding drum, and an individual value of a thickness of the suspension; and a second processing including calculating a rotation amount of the winding drum with respect to a lifting/lowering amount of the lift stage based on the individual value of the entire length of the suspension, the individual value of the diameter of the winding drum, and the individual value of the thickness of the suspension calculated in the first processing.

2. The overhead transport vehicle according to claim 1, wherein in the first processing, the individual value of the entire length of the suspension, the individual value of the diameter of the winding drum, and the individual value of the thickness of the suspension are calculated using a fact that the lifting/lowering amount of the lift stage is approximated by a square function of the rotation amount of the winding drum, the square function including as coefficients, the individual value of the entire length of the suspension, the individual value of the diameter of the winding drum, and the individual value of the thickness of the suspension.

3. The overhead transport vehicle according to claim 2, wherein in the first processing, the individual value of the entire length of the suspension, the individual value of the diameter of the winding drum, and the individual value of the thickness of the suspension are calculated based on a data group including two or more pieces of sample data including the lifting/lowering amount of the lift stage and the rotation amount of the winding drum at a time of that lifting/lowering amount.

4. The overhead transport vehicle according to claim 3, wherein in the first processing, the individual value of the entire length of the suspension, the individual value of the diameter of the winding drum, and the individual value of the thickness of the suspension are calculated based on the following equations:

$$L = An^2 + Bn + C \quad (1)$$

$$-\pi t = A \quad (2)$$

$$\pi(D + 2tn_0) = B \quad (3)$$

$$L_0 - \pi n_0(D + tn_0) = C = 0 \quad (4)$$

$$A = \frac{\sum_{i=1}^{N} n_i^2 \times \sum_{i=1}^{N} L_i n_i^2 - \sum_{i=1}^{N} n_i^3 \times \sum_{i=1}^{N} L_i n_i^2}{\sum_{i=1}^{N} n_i^4 \times \sum_{i=1}^{N} n_i^2 - \sum_{i=1}^{N} n_i^3 \times \sum_{i=1}^{N} n_i^3} \quad (5)$$

$$B = \frac{-\sum_{i=1}^{N} n_i^3 \times \sum_{i=1}^{N} L_i n_i^2 + \sum_{i=1}^{N} n_i^4 \times \sum_{i=1}^{N} L_i n_i}{\sum_{i=1}^{N} n_i^4 \times \sum_{i=1}^{N} n_i^2 - \sum_{i=1}^{N} n_i^3 \sum_{i=1}^{N} n_i^3} \quad (6)$$

where L is the lifting/lowering amount of the lift stage, n is the rotation amount of the winding drum, t is the individual value of the thickness of the suspension, D is the individual value of the diameter of the winding drum, $L_0$ is the individual value of the entire length of the suspension, $n_0$ is the rotation amount of the winding drum when the lift stage is positioned at an origin position, N is a number of samples that is an integer of 2 or more, $n_i$ is the rotation amount of the winding drum in an ith sample, and $L_i$ is the lifting/lowering amount of the lift stage in the ith sample.

5. The overhead transport vehicle according to claim 3, wherein the controller is configured or programmed to execute:

a first data acquiring processing of acquiring, as a first distance, a distance detected by a sensor that detects a distance between a first measurer held on the lift stage and a second measurer disposed immediately below the first measurer in a state where the lift stage is positioned at the origin position;

a second data acquiring processing of acquiring a distance detected by the sensor as a second distance in a state where the lift stage is lifted or lowered by a set lifting/lowering amount and acquiring a value obtained by subtracting the first distance from the second distance and the rotation amount of the winding drum at a time of the set lifting/lowering amount as the lifting/lowering amount of the lift stage and the rotation amount of the winding drum in the sample data; and a third data acquiring processing of repeatedly executing the second data acquiring processing while changing the set lifting/lowering amount.

6. The overhead transport vehicle according to claim 5, further comprising an input capable of inputting the set lifting/lowering amount in each of the second data acquiring processing performed a plurality of times.

7. The overhead transport vehicle according to claim 1, wherein in the second processing, the rotation amount of the winding drum with respect to the lifting/lowering amount of the lift stage is calculated based on the following equation:

$$L = L_0 - \pi(D(n_0-n) + t(n_0-n)^2) \quad (7)$$

where L is the lifting/lowering amount of the lift stage, n is the rotation amount of the winding drum, t is the individual value of the thickness of the suspension, D is the individual value of the diameter of the winding drum, $L_0$ is the individual value of the entire length of the suspension, and $n_0$ is the rotation amount of the winding drum when the lift stage is positioned at an origin position.

* * * * *